(12) United States Patent
Schubert et al.

(10) Patent No.: US 10,559,719 B2
(45) Date of Patent: Feb. 11, 2020

(54) SOLID-STATE RADIATION TRANSDUCER DEVICES HAVING AT LEAST PARTIALLY TRANSPARENT BURIED-CONTACT ELEMENTS, AND ASSOCIATED SYSTEMS AND METHODS

(71) Applicant: Micron Technology, Inc., Boise, ID (US)

(72) Inventors: Martin F. Schubert, Sunnyvale, CA (US); Vladimir Odnoblyudov, Danville, CA (US); Lifang Xu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/594,392

(22) Filed: May 12, 2017

(65) Prior Publication Data

US 2017/0250313 A1    Aug. 31, 2017

Related U.S. Application Data

(62) Division of application No. 15/227,198, filed on Aug. 3, 2016, now Pat. No. 9,653,654, which is a division
(Continued)

(51) Int. Cl.
*H01L 33/60* (2010.01)
*H01L 33/38* (2010.01)
(Continued)

(52) U.S. Cl.
CPC ........ *H01L 33/382* (2013.01); *H01L 33/0079* (2013.01); *H01L 33/0095* (2013.01);
(Continued)

(58) Field of Classification Search
None
See application file for complete search history.

(56) References Cited

U.S. PATENT DOCUMENTS

| 7,385,226 B2 | 6/2008 | Ou et al. |
| 7,495,259 B2 | 2/2009 | Sakamoto et al. |

(Continued)

FOREIGN PATENT DOCUMENTS

| KR | 20110109497 A | 10/2011 |
| KR | 101093208 A | 12/2011 |

(Continued)

OTHER PUBLICATIONS

Office Action dated Apr. 17, 2015 in Taiwan Patent Application No. 102100141, 17 pages.
(Continued)

*Primary Examiner* — Abul Kalam
(74) *Attorney, Agent, or Firm* — Perkins Coie LLP (57) ABSTRACT

Solid-state radiation transducer (SSRT) devices having buried contacts that are at least partially transparent and associated systems and methods are disclosed herein. An SSRT device configured in accordance with a particular embodiment can include a radiation transducer including a first semiconductor material, a second semiconductor material, and an active region between the first semiconductor material and the second semiconductor material. The SSRT device can further include first and second contacts electrically coupled to the first and second semiconductor materials, respectively. The second contact can include a plurality of buried-contact elements electrically coupled to the second semiconductor material. Individual buried-contact elements can have a transparent portion directly adjacent to the second semiconductor material. The second contact can further include a base portion extending between the buried-
(Continued)

contact elements, such as a base portion that is least partially planar and reflective.

18 Claims, 10 Drawing Sheets

Related U.S. Application Data of application No. 13/344,226, filed on Jan. 5, 2012, now Pat. No. 9,419,182.

(51) Int. Cl.
*H01L 33/00* (2010.01)
*H01L 33/42* (2010.01)
*H01L 33/40* (2010.01)
*H01L 33/06* (2010.01)
*H01L 33/32* (2010.01)
*H01L 33/50* (2010.01)
*H01L 33/56* (2010.01)
*H01L 33/30* (2010.01)

(52) U.S. Cl.
CPC .............. *H01L 33/06* (2013.01); *H01L 33/30* (2013.01); *H01L 33/32* (2013.01); *H01L 33/405* (2013.01); *H01L 33/42* (2013.01); *H01L 33/502* (2013.01); *H01L 33/56* (2013.01); *H01L 2933/0016* (2013.01)

(56) References Cited

U.S. PATENT DOCUMENTS

| | | | |
|---|---|---|---|
| 7,576,008 B2 | 8/2009 | Kim et al. | |
| 7,842,963 B2 | 11/2010 | Schiaffino et al. | |
| 8,338,848 B2 | 12/2012 | Hasnain et al. | |
| 8,581,276 B2 | 11/2013 | Lee et al. | |
| 8,796,665 B2 | 8/2014 | Sills et al. | |
| 8,809,897 B2 | 8/2014 | Odnoblyudov et al. | |
| 8,963,121 B2 | 2/2015 | Odnoblyudov et al. | |
| 9,443,834 B2 | 9/2016 | Tetz et al. | |
| 2005/0104081 A1 | 5/2005 | Kim et al. | |
| 2007/0176188 A1 | 8/2007 | Tanaka et al. | |
| 2008/0096297 A1 | 4/2008 | Schiaffino et al. | |
| 2009/0020768 A1 | 1/2009 | Butcher et al. | |
| 2009/0267105 A1 | 10/2009 | Yu et al. | |
| 2009/0283787 A1 | 11/2009 | Donofrio et al. | |
| 2010/0019268 A1* | 1/2010 | Illek | H01L 33/145 257/99 |
| 2010/0171135 A1* | 7/2010 | Engl | H01L 33/382 257/98 |
| 2010/0187559 A1* | 7/2010 | Han | H01L 33/20 257/99 |
| 2011/0062472 A1 | 3/2011 | Shchekin | |
| 2011/0233588 A1* | 9/2011 | Deguchi | H01L 33/38 257/98 |
| 2012/0007118 A1 | 1/2012 | Choi et al. | |
| 2012/0049219 A1 | 3/2012 | Kamiya et al. | |
| 2012/0074441 A1* | 3/2012 | Seo | H01L 27/153 257/91 |
| 2012/0126259 A1 | 5/2012 | Mizutani et al. | |
| 2012/0223359 A1 | 9/2012 | Han | |
| 2013/0020596 A1* | 1/2013 | Kim | H01L 33/0079 257/95 |
| 2013/0048940 A1* | 2/2013 | Sills | H01L 31/022441 257/13 |
| 2013/0049059 A1 | 2/2013 | Odnoblyudov et al. | |
| 2013/0320370 A1* | 12/2013 | Schubert | H01L 33/405 257/98 |
| 2016/0343912 A1 | 11/2016 | Odnoblyudov et al. | |

FOREIGN PATENT DOCUMENTS

| | | |
|---|---|---|
| KR | 20110136111 A | 12/2011 |
| KR | 20110139909 A | 12/2011 |
| TW | 201135976 A | 10/2011 |
| TW | 201145589 A | 12/2011 |

OTHER PUBLICATIONS

International Search Report and Written Opinion dated Apr. 26, 2013 in International Application No. PCT/US2012/070468, 11 pages.

Jian-Ming, Z. et al., AlGaInP Thin-Film LED with Omni-Directionally Reflector and ITO Transparent Conducting N-Type Contact, Chinese Physics, vol. 16, No. 11, pp. 3498-3501, Nov. 2007, doi: 10.1088/1009-1963/16/11/057.

* cited by examiner

SOLID-STATE RADIATION TRANSDUCER DEVICES HAVING AT LEAST PARTIALLY TRANSPARENT BURIED-CONTACT ELEMENTS, AND ASSOCIATED SYSTEMS AND METHODS

CROSS-REFERENCE TO RELATED APPLICATION(S)

This application is a divisional of U.S. patent application Ser. No. 15/227,198, filed Aug. 3, 2016, now U.S. Pat. No. 9,653,654, which is a divisional of U.S. patent application Ser. No. 13/344,226, filed Jan. 5, 2012, now U.S. Pat. No. 9,419,182, each of which is incorporated herein by reference in its entirety.

TECHNICAL FIELD

The present technology is related to solid-state radiation transducer devices and methods of making solid-state radiation transducer devices. In particular, the present technology relates to solid-state radiation transducer devices having buried-contact elements that are at least partially transparent, and associated systems and methods.

BACKGROUND

Figure 1:
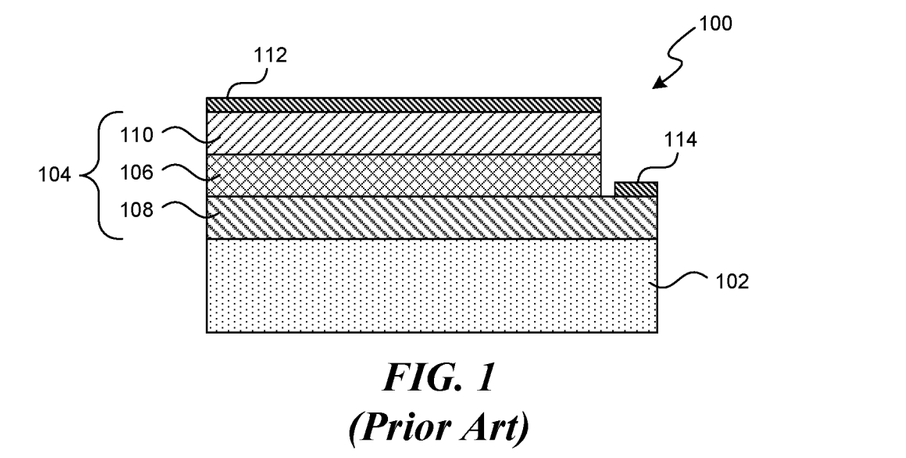
FIG. 1 is a partially-schematic, cross-sectional diagram illustrating an LED device having a lateral configuration in accordance with the prior art.

Solid-state radiation transducers (SSRTs), e.g., light-emitting diodes (LEDs), organic light-emitting diodes, and polymer light-emitting diodes, are used in numerous modern devices for backlighting, general illumination, and other purposes. FIG. 1 is a partially-schematic, cross-sectional view of a conventional LED device 100 having a lateral configuration. As shown in FIG. 1, the LED device 100 can include a growth substrate 102 under an LED structure 104 with an active region 106 positioned between an N-type layer 108 and a P-type layer 110. The device 100 can also include a first contact 112 electrically connected to the P-type layer 110 and a second contact 114 electrically connected to the N-type layer 108. As shown in FIG. 1, the second contact 114 extends across only a small portion of the N-type layer 108. This type of limited connection between the second contact 114 and the N-type layer 108 can cause poor current spreading within the N-type layer 108, especially when the N-type layer 108 includes N-type gallium nitride, which has relatively low lateral conductivity. Poor current spreading can cause portions of the device 100 to be underutilized and can lower the lumen output and/or the efficiency of the device 100.

Figure 2:
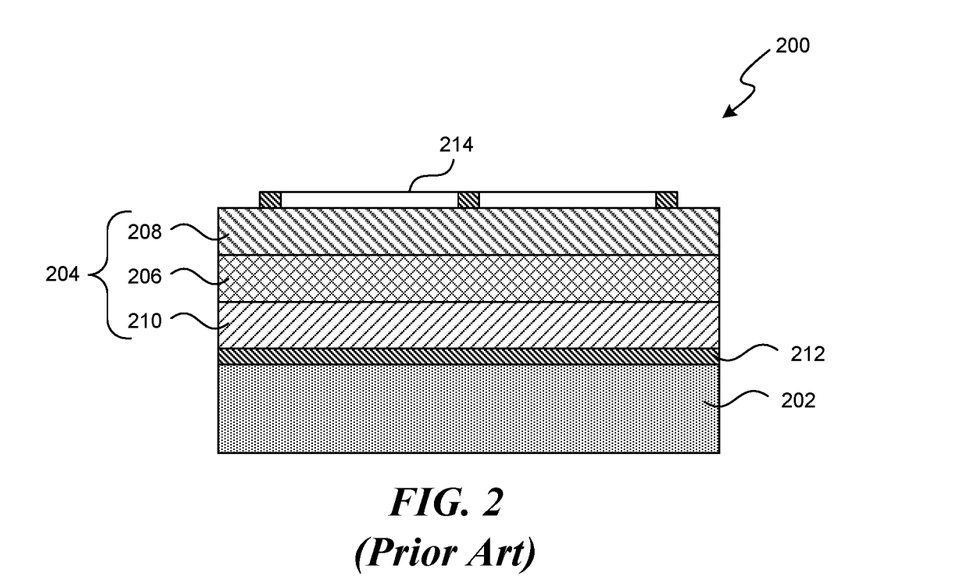
FIG. 2 is a partially-schematic, cross-sectional diagram illustrating an LED device having a vertical configuration in accordance with the prior art.

FIG. 2 is a partially-schematic, cross-sectional view of another conventional LED device 200 having a vertical configuration that can have enhanced current spreading relative to the device 100 of FIG. 1. The device 200 includes a carrier substrate 202 and an LED structure 204 with an active region 206 positioned between an N-type layer 208 and a P-type layer 210. During formation of the LED device 200, the N-type layer 208, the active region 206, and the P-type layer 210 can be formed sequentially on a growth substrate (not shown) similar to the growth substrate 102 shown in FIG. 1. A first contact 212 can be formed on the P-type layer 210, and the carrier substrate 202 can be attached to the first contact 212. The growth substrate can then be removed and a second contact 214 can be formed, e.g., in a pattern, on the N-type layer 208. The device 200 can then be inverted to produce the orientation shown in FIG. 2. As shown in FIG. 2, the second contact 214 extends across a significant portion of the N-type layer 208. This can facilitate current spreading within the N-type layer 208 resulting in improved lumen output and/or efficiency of the device 200. In the vertical configuration shown in FIG. 2, however, the second contact 212 can disadvantageously interfere with emissions from the LED structure 204. The footprint of the second contact 212 can be reduced, e.g., to a series of lines as shown in FIG. 2, but cannot be made insignificant in this configuration without sacrificing the enhanced current spreading.

Figure 3:
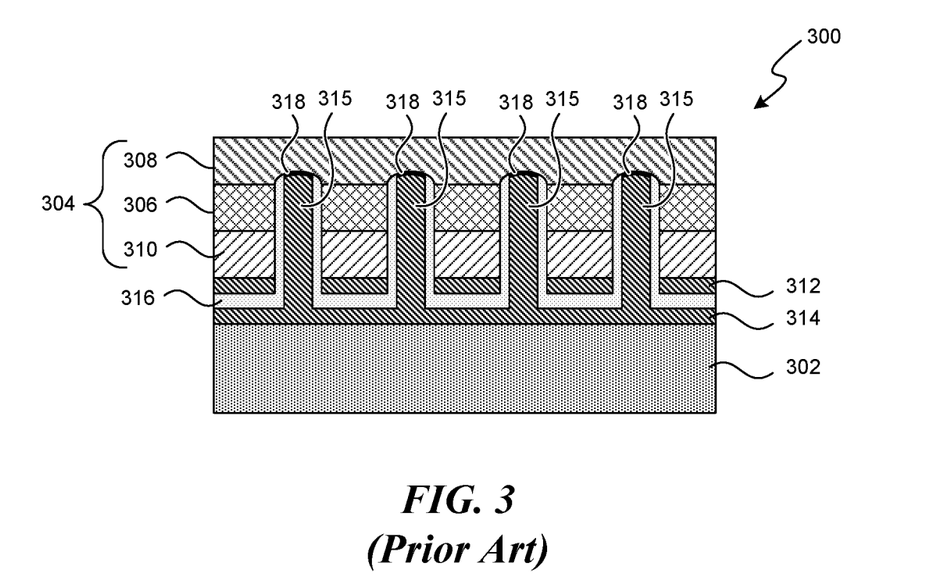
FIG. 3 is a partially-schematic, cross-sectional diagram illustrating an LED device having a buried-contact configuration in accordance with the prior art.

FIG. 3 is a partially-schematic cross-sectional view of another conventional LED device 300 having a buried-contact configuration in which the second contact can facilitate enhanced current spreading relative to the device 100 of FIG. 1 while interfering less with device emissions than in the device 200 of FIG. 2. Similar to the device 200 of FIG. 2, the device 300 can include a carrier substrate 302 and an LED structure 304 having an active region 306 positioned between an N-type layer 308 and a P-type layer 310. Also similar to the device 200 of FIG. 2, the device 300 can include a first contact below the P-type layer 310. As shown in FIG. 3, the device 300 can include a second contact 314 with buried-contact elements 315 that extend through the first contact 312, the P-type layer 310, and the active region 306, and partially into the N-type layer 308. A dielectric layer 316 can electrically isolate the second contact 314 from the first contact 312, the P-type layer 310, and the active region 306. The second contact 314 can be electrically connected to the N-type layer 308 at multiple transition regions 318 distributed across the area of the N-type layer 308. Distributing the transition regions 318 can enhance current spreading within the N-type layer 308. Furthermore, since much of the second contact 314 is below the P-type layer 310, the second contact 314 can interfere less with emissions from the LED structure 304 than the second contact 212 interferes with emissions from the LED structure 204 of the LED device 200 shown in FIG. 2.

Although the buried-contact configuration shown in FIG. 3 is an improvement in many ways relative to the lateral configuration shown in FIG. 1 and the vertical configuration shown in FIG. 2, it still has significant drawbacks. For example, many modern LED devices include color-converting materials, e.g., phosphors, positioned in the path of emissions from an LED structure. Color-converting materials can absorb light that an LED structure emits at a certain wavelength range and emit light at a different wavelength range. Color-converting materials typically release light in all directions, including back toward the LED structure. Reflection of the light emitted back toward the LED structure can be an important factor in determining lumen output and efficiency of a device. The uniformity of this reflection also can be important, particularly in display and projection applications. Conventional buried contacts typically interfere with this reflection and/or other performance-related reflection to some degree. For example, the transition regions 318 shown in FIG. 3 can absorb light and cause undesirable dark spots in the near field. For this reason and/or other reasons, there is a continuing need for innovation with regard to SSRT devices, such as to improve the lumen output, efficiency, and output uniformity of buried-contact SSRT devices.

BRIEF DESCRIPTION OF THE DRAWINGS

Many aspects of the present disclosure can be better understood with reference to the following drawings. The components in the drawings are not necessarily to scale.

Instead, emphasis is placed on illustrating clearly the principles of the present disclosure.

DETAILED DESCRIPTION

Specific details of several embodiments of solid-state radiation transducer ("SSRT") devices and associated systems and methods are described below. The term "SSRT" generally refers to solid-state devices that include a semiconductor material as the active medium to convert electrical energy into electromagnetic radiation in the visible, ultraviolet, infrared, and/or other spectra. For example, SSRTs include solid-state light emitters, e.g., LEDs, laser diodes, etc., and/or other sources of emission other than electrical filaments, plasmas, or gases. SSRTs can alternately include solid-state devices that convert electromagnetic radiation into electricity. Additionally, depending upon the context in which it is used, the term "substrate" can refer to a wafer-level substrate or to a singulated, die-level substrate. A person having ordinary skill in the relevant art will recognize that each stage of the processes described below can be performed at the wafer level or at the die level. A person having ordinary skill in the relevant art will also understand that the present technology may have additional embodiments, and that the present technology may be practiced without several of the details of the embodiments described below with reference to FIGS. 4-11.

For ease of reference, throughout this disclosure identical reference numbers are used to identify similar or analogous components or features, but the use of the same reference number does not imply that the parts should be construed to be identical. Indeed, in many examples described herein, the identically-numbered parts are distinct in structure and/or function. Furthermore, the same shading is sometimes used to indicate materials in cross section that can be compositionally similar, but the use of the same shading does not imply that the materials should be construed to be identical.

Figure 4:
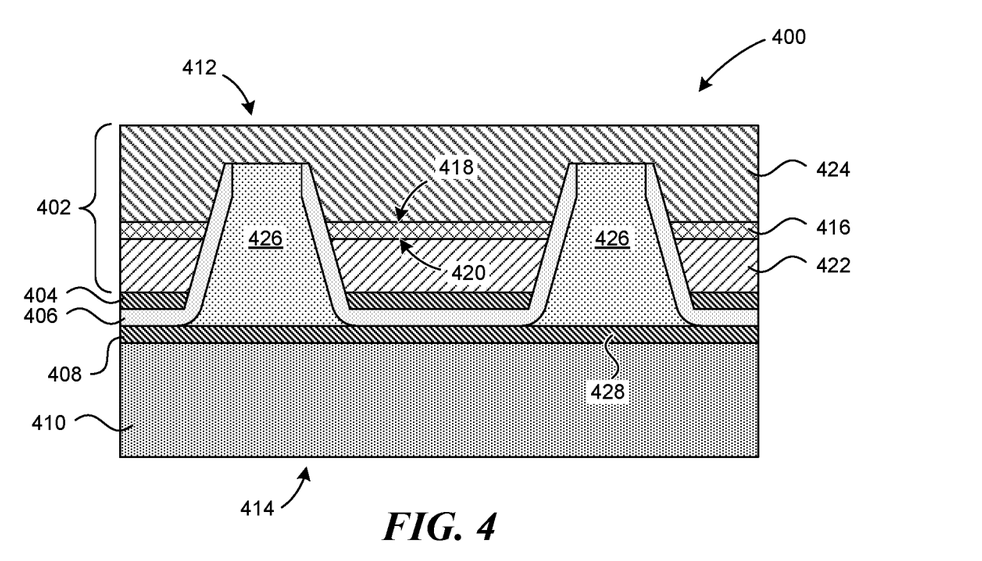
FIG. 4 is a partially-schematic, cross-sectional diagram illustrating an SSRT device configured in accordance with an embodiment of the present technology and having buried contacts with transparent portions in tapered vias.

FIG. 4 is a partially-schematic, cross-sectional diagram illustrating an SSRT device 400 configured in accordance with an embodiment of the present technology. The SSRT device 400 can include a transducer structure 402, a first contact 404, a dielectric 406, and a second contact 408 supported by a carrier substrate 410. As shown in FIG. 4, the SSRT device 400 can have a first side 412 and a second side 414 facing away from the first side 412. The transducer structure 402 can include an active region 416 having a first side 418 and a second side 420 opposite the first side 418. The transducer structure 402 can further include a first semiconductor material 422 at the second side 420 of the active region 416, and a second semiconductor material 424 at the first side 418 of the active region 416. The first contact 404 can be electrically coupled to the first semiconductor material 422. The second contact 408 can include buried-contact elements 426 and a generally planar base portion 428 extending between the buried-contact elements 426. The buried-contact elements 426 can extend between the base portion 428 and the second semiconductor material 424 and can be electrically coupled to the second semiconductor material 424. The buried-contact elements 426 can be at least partially transparent. For example, a portion of the buried-contact elements 426, e.g., a portion adjacent to the second semiconductor material 424, can have a primary composition that is conductive and transparent. This portion can be relatively small, e.g., less than about 10% by volume of the buried-contact elements 426, or relatively large, e.g., at least about 50% by volume of the buried-contact elements 426. In some embodiments, the buried-contact elements 426 are entirely transparent. Suitable conductive and transparent materials for use in the buried-contact elements 426 and other conductive and transparent elements described herein include, for example, indium tin oxide, doped zinc oxide (e.g., aluminum-doped, gallium-doped, and indium-doped zinc oxide), conductive polymers (e.g., polyaniline and poly(3,4-ethylenedioxythiophene)), carbon allotropes (e.g., carbon nanotubes and graphene), and combinations thereof In some embodiments, the buried-contact elements 426 include indium tin oxide, zinc oxide, or a combination thereof.

As used herein, elements positioned on or at the first side 412 of the SSRT device 400 can be positioned in the region bounded by the first side 418 of the active region 416 and the external surface. Elements positioned on or at the second side 414 of the SSRT device 400 can be positioned in the region bounded by the second side 420 of the active region 416 and the opposing external surface. As materials are added to or removed from the SSRT device 400 during different stages of the formation process, the exterior surfaces of the first and second sides 412, 414 of the SSRT device 400 may change. Accordingly, the external boundaries of the first and second sides 412, 414 may change. In contrast, the internal boundaries of the first and second sides 412, 414 do not change, i.e., the first side 412 of the SSRT device 400 is consistently bounded internally by the first side 418 of the active region 416, and the second side 414 of the SSRT device 400 is consistently bounded internally by the second side 420 of the active region 416.

In conventional buried-contact SSRT devices e.g., the LED device 300 shown in FIG. 3, regions between buried-contact elements and semiconductor materials, e.g., the transition regions 318 shown in FIG. 3, typically have relatively low reflectivity. This can result, for example, from steps conventionally used to form an adequate electrical connection between buried-contact elements and semiconductor materials. For example, in conventional buried-contact SSRT devices, metal typically is deposited into buried-contact vias and then heated in an annealing step to form an alloy at interfaces between the metal and a semiconductor material. Without some form of annealing, an adequate electrical connection to certain semiconductor materials, e.g., N-type gallium nitride, can be difficult to achieve. The alloy resulting from an annealing step typically has low reflectivity even if the contact being electrically connected to the semiconductor material includes a high-reflectivity material. Due to this and/or other factors, conventional buried-contact elements typically interfere with an SSRT device's ability to reflect light, e.g., backscatter radiation from color-converting particles. As discussed above, such interference can be detrimental to a variety of performance characteristics, e.g., lumen output, efficiency, and output uniformity.

With reference again to FIG. 4, in some embodiments configured in accordance with the present technology, a transparent portion, member, or material can facilitate electrical connection between the second contact 408 and the second semiconductor material 424 without the need to form a low-reflectivity alloy. For example, in some of these embodiments, light directed toward the transducer structure 402 can travel through an electrical interface between the second contact 408 and the second semiconductor material 424 to a reflective portion of the second contact 408 or to another reflective element proximate the buried-contact elements 426. A significant percentage of this light can be reflected toward the first side 412 of the SSRT device 400, e.g., to improve lumen output, efficiency, and/or output uniformity. In addition to or instead of this benefit, embodiments of the present technology can derive one or more other benefits from a transparent portion, member, or material. For example, in a conventional buried-contact SSRT device, e.g., the LED device 300 shown in FIG. 3, some emissions from an active region typically are directed toward side surfaces of the buried-contact elements. For example, in the LED device 300 shown in FIG. 3, emissions from the active region 306 can be directed through the dielectric layer 316 to side surfaces of the buried-contact elements 315. The reflectivity of these side surfaces can be disrupted as a secondary consequence of the annealing step described above. Furthermore, even if the side surfaces have high reflectivity, they can redirect emissions in a manner that disrupts output uniformity and/or decreases efficiency. With reference again to FIG. 4, in the SSRT device 400, some emissions from the active region 416 may be transmitted through the buried-contact elements 426 with little or no interference. As a result, a performance characteristic of the SSRT device 400, e.g., lumen output, efficiency, and/or output uniformity, can be improved.

Figure 5:
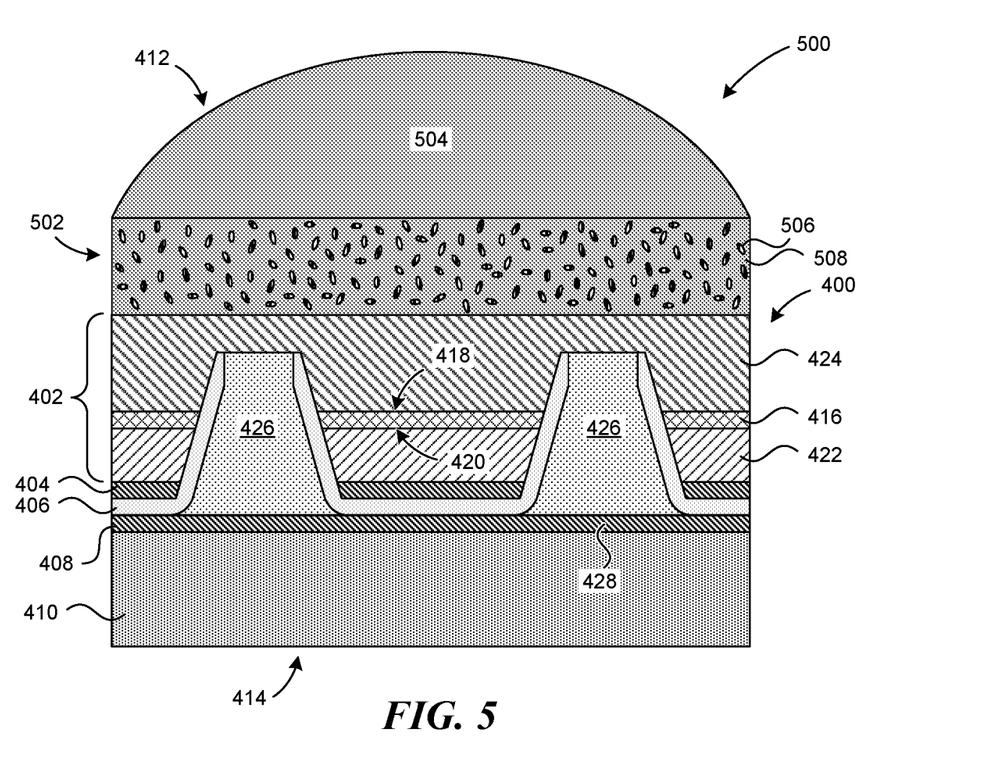
FIG. 5 is a partially-schematic, cross-sectional diagram illustrating the SSRT device shown in FIG. 4 further including a color-converting component and an encapsulant lens.

FIG. 5 is a partially-schematic, cross-sectional diagram illustrating an SSRT device 500 including the SSRT device 400 shown in FIG. 4, a color-converting component 502, and an encapsulant lens 504. The color-converting component 502 includes color-converting particles 506 distributed within a matrix 508. Suitable color-converting materials within the color-converting particles 506 can include, for example, quantum dots and/or phosphor materials that exhibit luminescence. Examples of suitable phosphor materials include, for example, cerium(III)-doped yttrium aluminum garnet (YAG), neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and combinations thereof, among others. The matrix 508 and the encapsulant lens 504 can be transparent and can have the same or different compositions. For example, the matrix 508 and/or the encapsulant lens 504 can include a transparent epoxy, silicone, polyimide, acrylic, a combination thereof, or another suitable material. As discussed above, the color-converting particles 506 can absorb light that the transducer structure 402 emits at a certain wavelength range and emit light at a different wavelength range. Some of the light that the color-converting particles 506 emit can be directed back toward the transducer structure 402 as backscatter radiation. Other portions of the SSRT device 500 and/or structures around the SSRT device 500 also can generate backscatter radiation. For example, the encapsulant lens 504 can emit a relatively small amount of backscatter radiation. The SSRT device 500 also may be incorporated into a reflective cavity (not shown) that helps impart directionality to emissions from the SSRT device 500, but also increases backscatter radiation. The SSRT device 500 can have a relatively high reflectivity with regard to backscatter radiation from the color-converting particles 506 or another source. For example, the SSRT device 500 can have an average reflectivity of backscatter radiation from the color-converting particles at the buried-contact elements 426 greater than about 75%, e.g., greater than about 80%.

FIGS. 6A-6F illustrate a method for making the SSRT device 400 shown in FIG. 4 according to an embodiment of the present technology. Only selected stages are shown to illustrate certain aspects of the present technology. At the stage shown in FIG. 6A, the transducer structure 402, including the active region 416 and the first and second semiconductor materials 422, 424, has already been formed on a growth substrate 600. The SSRT device 400 is upside down relative to its orientation in FIG. 4. The first and second semiconductor materials 422, 424 can be doped semiconductor materials. For example, the first semiconductor material 422 can be a P-type semiconductor material, e.g., P-type gallium nitride, and the second semiconductor material 424 can be an N-type semiconductor material, e.g., N-type gallium nitride. This configuration is suitable when the transducer structure 402 is formed on an opaque or translucent growth substrate 600 and subsequently attached to a carrier substrate, e.g., the carrier substrate 410 shown in FIG. 4. In other embodiments, the first and second semiconductor materials 422, 424 can be reversed. The active region 416 between the first and second semiconductor materials 422, 424 can include a single quantum well, multiple quantum wells, and/or a single-grain semiconductor material, e.g., indium gallium nitride. In other embodiments, the transducer structure 402 can include other suitable semiconductor materials, such as gallium arsenide, aluminum gallium arsenide, gallium arsenide phosphide, or a combination thereof, among others. The transducer structure 402 can be formed by metal organic chemical vapor deposition, molecular beam epitaxy, liquid phase epitaxy, hydride vapor phase epitaxy, combinations thereof, or other suitable formation processes known in the semiconductor fabrication arts.

Figure 6A:
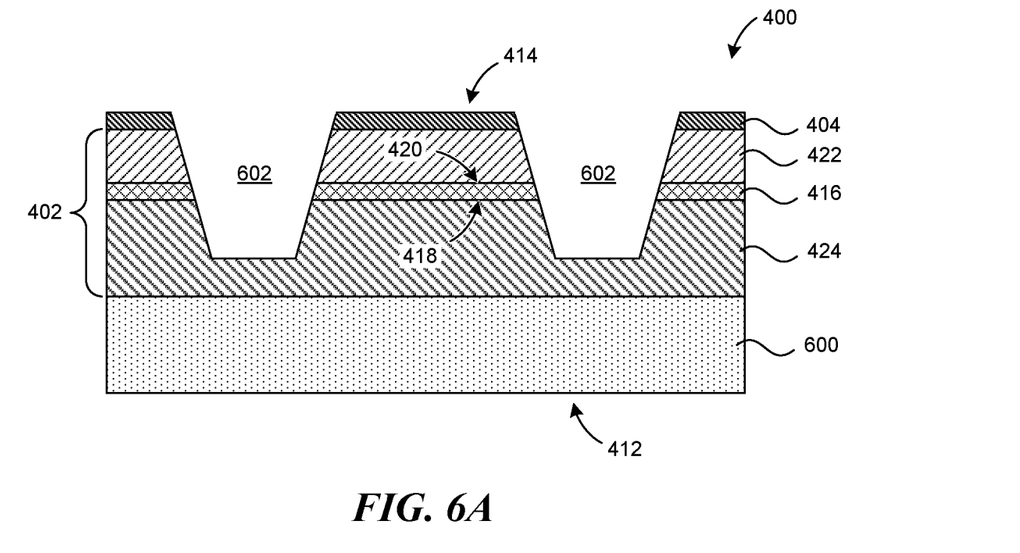
FIGS. 6A-6F are partially-schematic, cross-sectional diagrams illustrating selected stages in a method for making the SSRT device shown in FIG. 4.

At the stage shown in FIG. 6A, the first contact 404 also has been formed. The first contact 404 can extend over a large portion of the underlying first semiconductor material 422. In other embodiments, the first contact 404 can be formed over a smaller portion of the first semiconductor material 422. The first contact 404 can include a reflective contact material, e.g., titanium, nickel, silver, aluminum, gold, or a combination thereof, among others. As discussed in greater detail below, during a subsequent processing stage, the transducer structure 402 can be inverted such that the first contact 404 can redirect emissions, e.g., light, back through the transducer structure 402 toward the first side 412 of the SSRT device 400. In other embodiments, the first contact 404 can be made from a non-reflective material, and the SSRT device 400 can include separate reflective elements positioned at the second side 414 of the SSRT device 400. The first contact 404 can be formed using chemical vapor deposition, physical vapor deposition, atomic layer deposition, spin coating, patterning, combinations thereof, or other suitable formation processes known in the semiconductor fabrication arts.

As shown in FIG. 6A, vias 602 can extend through the first contact 404, the first semiconductor material 422, the active region 416, and part of the second semiconductor material 424. In the illustrated embodiment, the vias 602 are shown tapered with narrowing cross-sectional dimensions from a plane defined by the first contact 404 to the second semiconductor material 424. In other embodiments, the vias 602 can have a different shape. Furthermore, although the vias 602 are shown extending into part of the second semiconductor material 424, in other embodiments, the vias 602 can end at or near a border of the second semiconductor material 424. In some embodiments, the vias 602 are formed before the first contact 404 and the first contact 404 is formed in a pattern around the vias 602, e.g., to extend the vias. A variety of suitable processes can be used to form the vias 602, e.g., wet, dry, isotropic, and anisotropic etching processes performed in conjunction with photolithography, among others.

Figure 6B:
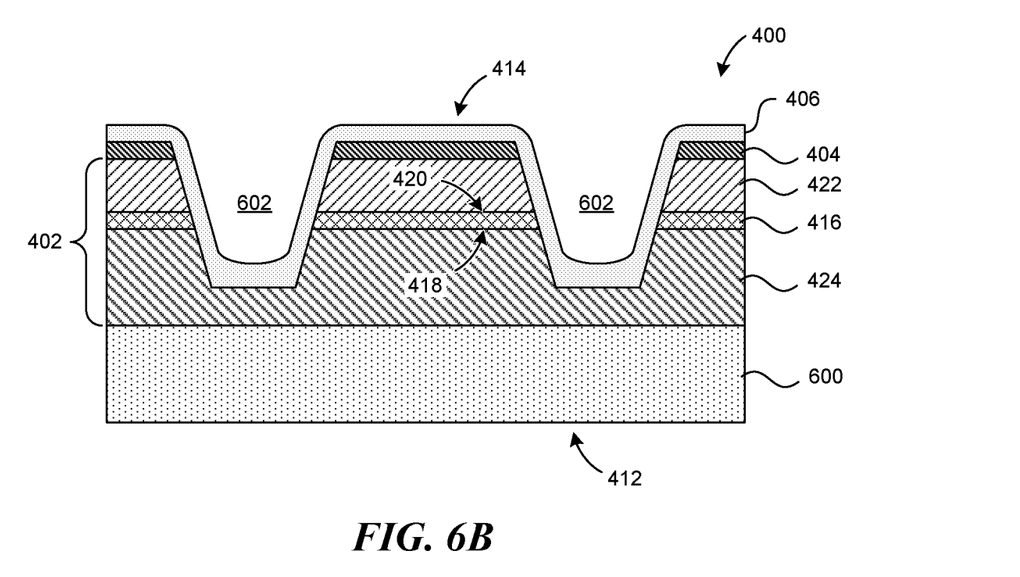

FIG. 6B shows a stage in the process after the dielectric 406 is formed over the first contact 404 and within the vias 602. In other embodiments, portions of the dielectric 406 within the vias 602 and outside the vias 602 can be formed separately. The dielectric 406 can electrically isolate the first contact 404 from the second contact 408 (FIG. 4) and electrically isolate the buried-contact elements 426 (FIG. 4) from the first contact 404, the first semiconductor material 422, and the active region 416. Suitable dielectric materials for use in the dielectric 406 include, for example, silicon dioxide, silicon nitride, and combinations thereof, among others. In embodiments in which portions of the dielectric 406 within the vias 602 and outside the vias 602 are formed separately, the separate portions can have different compositions. In some embodiments, the dielectric 406 or at least a portion of the dielectric 406 within the vias 602 is transparent. The dielectric 406 can be formed using chemical vapor deposition, physical vapor deposition, atomic layer deposition, spin coating, patterning, combinations thereof, or other suitable formation processes known in the semiconductor fabrication arts.

Figure 6C:
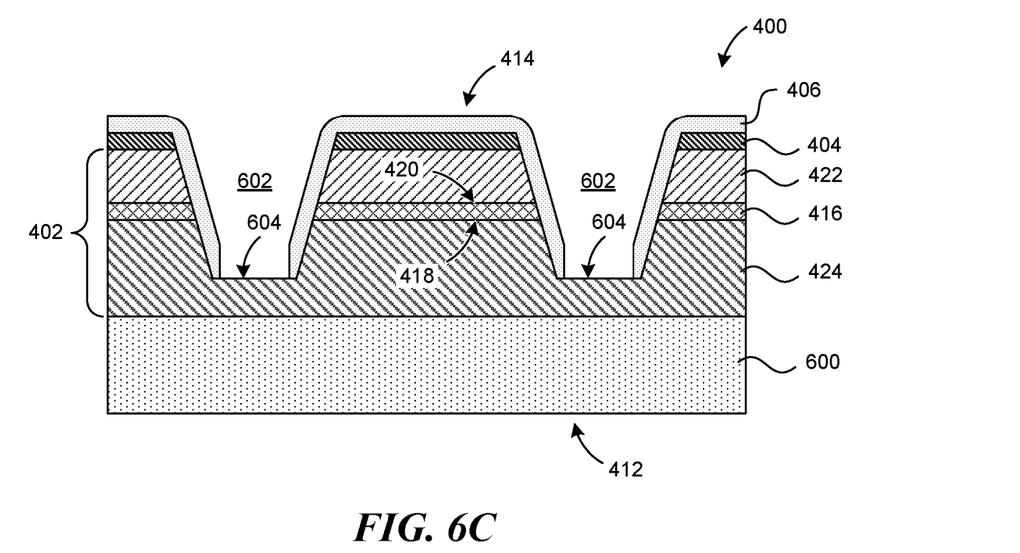

As shown in FIG. 6C, the dielectric 406 can be patterned, e.g., etched or otherwise selectively deposited, to form exposed portions 604 of the second semiconductor material 424 at lower ends of the vias 602. In other embodiments, a portion of the second semiconductor material 424 can be etched along with portions of the dielectric 406 at the lower ends of the vias 602. In still other embodiments, the dielectric 406 can be otherwise selectively deposited to leave portions of the second semiconductor material 424 exposed. The exposed portions 604 are shown flat in FIG. 6C, but can alternatively be three-dimensional. For example, etching, e.g., etching that removes a portion of the second semiconductor material 424, or selective deposition can be used to expose a three-dimensional portion of the second semiconductor material 424. The exposed portions 604 also can be roughened either at the time of formation or through subsequent processing. Increased dimensionality and/or roughness can be useful, for example, to increase the contact area between a transparent portion of the buried-contact elements 426 (FIG. 4) and the second semiconductor material 424. In some embodiments, increased contact area can mitigate deficiencies, if any, in an electrical connection between a subsequently disposed transparent material and the second semiconductor material 424. The dielectric 406 also can be etched or selectively deposited to leave portions of the first contact 404 exposed for eventual connection to leads (not shown) at the second side 414 of the SSRT device 400.

Figure 6D:
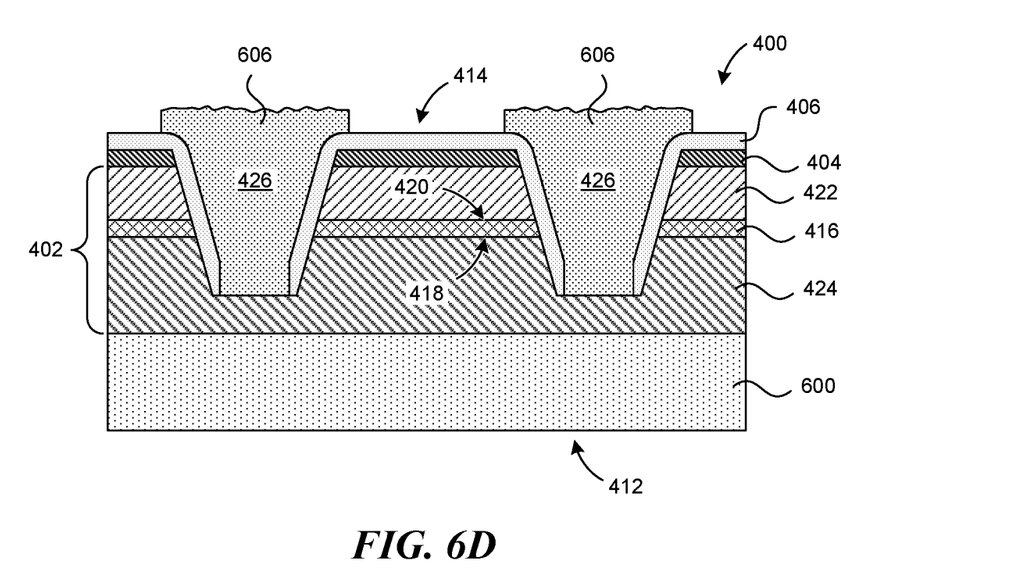
Figure 6E:
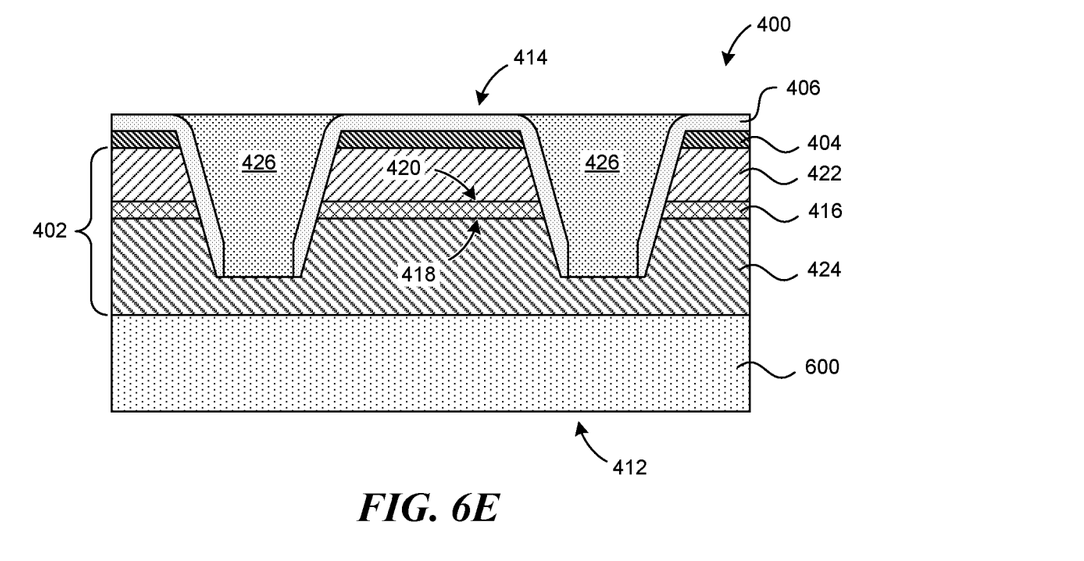

FIG. 6D shows a stage in the process after the buried-contact elements 426 are formed within the vias 602 (FIG. 6C). The buried-contact elements 426 can include, for example, indium tin oxide, doped zinc oxide (e.g., aluminum-doped, gallium-doped, and indium-doped zinc oxide), a conductive polymer (e.g., polyaniline and poly(3,4-ethylenedioxythiophene)), a carbon allotrope (e.g., carbon nanotubes and graphene), a combination thereof, or another suitable material. The buried-contact elements 426 can be formed using chemical vapor deposition, physical vapor deposition, atomic layer deposition, spin coating, patterning, combinations thereof, or other suitable formation processes known in the semiconductor fabrication arts. As shown in FIG. 6D, the buried-contact elements 426 initially include protruding upper portions 606. FIG. 6E shows a stage in the process after the protruding upper portions 606 have been removed, e.g., using chemical-mechanical planarization or another suitable planarization process known in the semiconductor fabrication arts. In some embodiments, a planarization process can be used to remove a portion of the dielectric 406 along with the protruding upper portions 606.

Figure 6F:
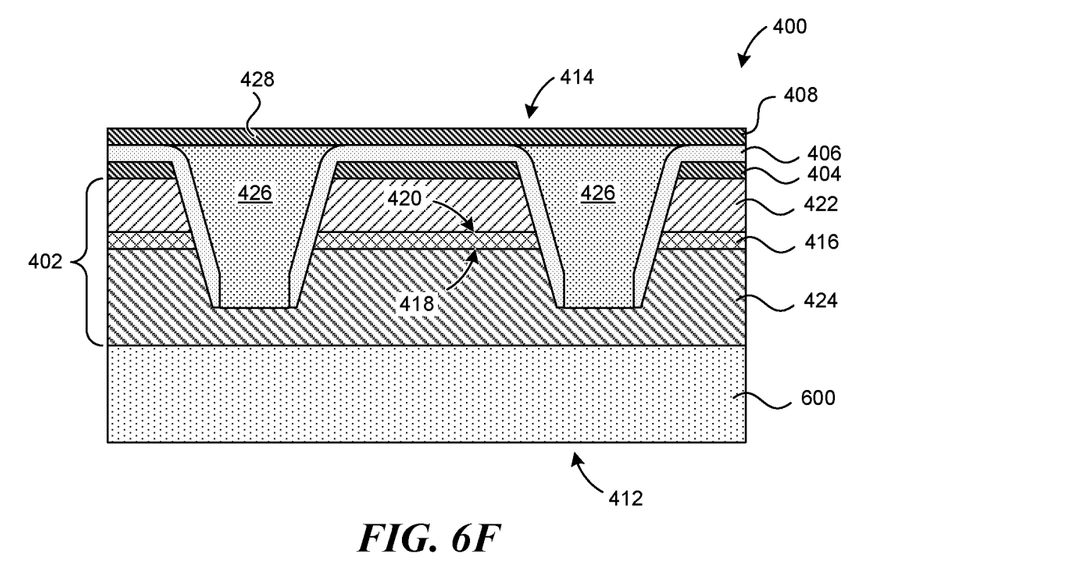

FIG. 6F shows a stage in the process after the base portion 428 of the second contact 408 has been formed on the buried-contact elements 426 and the dielectric 406. The base portion 428 can be formed, for example, using chemical vapor deposition, physical vapor deposition, atomic layer deposition, spin coating, patterning, combinations thereof, or other suitable formation processes known in the semiconductor fabrication arts. The base portion 428 can include a reflective contact material, e.g., titanium, nickel, silver, aluminum, gold, or a combination thereof, among others. Since the base portion 428 can be spaced apart from the second semiconductor material 424, the composition of the base portion 428 can be selected according to factors other than its ability to form an adequate electrical connection with the second semiconductor material 424. For example, the base portion 428 can include silver, which has very high reflectivity, but tends to form a poor electrical connection with at least some semiconductor materials, e.g., N-type gallium nitride. In some embodiments, the base portion 428 is patterned, e.g., etched or otherwise selectively deposited, to form a network of interconnects (not shown) between the buried-contact elements 426. In these and other embodiments, the base portion 428 can include reflective material at least at the buried-contact elements 426. Similarly, the base portion 428 can include reflective material at least at transparent portions of the buried-contact elements 426.

This can be useful, for example, to facilitate reflection of light passing through transparent material of the buried-contact elements 426. In some embodiments, portions of the second contact 608 not at the buried-contact elements 426 and/or not at transparent portions of the buried-contact elements 426 are not reflective or are absent, e.g., are removed or never formed.

After the stage shown in FIG. 6F, the growth substrate 600 can be removed and the carrier substrate 410 (FIG. 4) can be attached to form the SSRT device 400 shown in FIG. 4. The carrier substrate 410 can be configured to facilitate heat dissipation from other portions of the SSRT device 400. In some embodiments, the carrier substrate 410 has a coefficient of thermal expansion generally similar to that of the transducer structure 402, which can decrease the likelihood of delamination. The growth substrate 600 can be removed, for example, using grinding, etching, or another suitable removal process known in the semiconductor fabrication arts. In some embodiments, the SSRT device 400 is releasably attached to a temporary support prior to removing the growth substrate 600. A releasable connection can be made, for example, using WaferBOND™ HT-10.10 available from Brewer Science, Inc. (Rolla, Mo.). After or before the growth substrate 600 is removed, the SSRT device 400 can be singulated, e.g., a wafer including the SSRT device 400 can be diced. First and second terminals (not shown) can be included at the second side 414 of the SSRT device 400 to connect leads (not shown) to the first and second semiconductor materials 422, 424. In some embodiments, the SSRT device 400 can be integrated into a circuit without the need for wire bonds.

Figure 7:
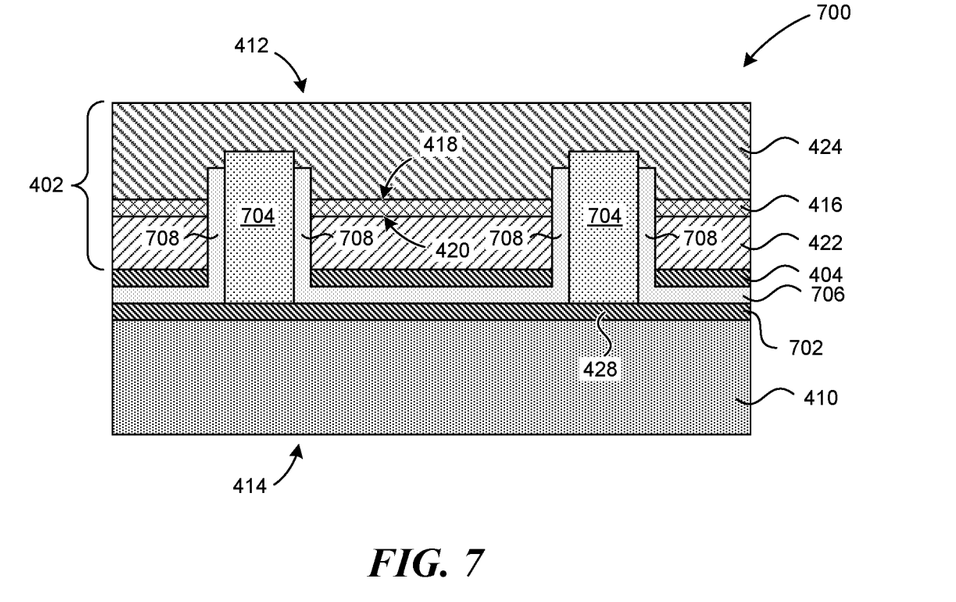
FIG. 7 is a partially-schematic, cross-sectional diagram illustrating an SSRT device configured in accordance with an embodiment of the present technology and having buried contacts with transparent portions in straight vias.

Vias, buried-contact elements, and dielectrics around buried-contact elements can have a variety of suitable shapes that may affect performance and processing of SSRT devices configured in accordance with embodiments of the present technology. For example, the buried-contact elements 426 are shown in FIG. 4 generally tapered with narrowing cross-sectional dimensions from a plane defined by the first contact 404 to the second semiconductor material 424. This generally-tapered shape can facilitate certain processing steps, such as deposition of the dielectric 406 shown in FIG. 6B. Uniform deposition of material onto walls of straight vias, for example, can be difficult to achieve using standard deposition techniques. Some embodiments, however, include generally straight buried-contact elements. For example, FIG. 7 illustrates an SSRT device 700 with a second contact 702 including buried-contact elements 704 that have generally straight sidewalls from a plane defined by the first contact 404 to the second semiconductor material 424. The SSRT device 700 can further include a dielectric 706 with generally-straight portions 708 extending around the buried-contact elements 704. The buried-contact elements 704 can be transparent and extend further into the second semiconductor material 424 than the straight portions 708 of the dielectric 706.

In comparison to the generally-tapered buried-contact elements 426 shown in FIG. 4, the generally-straight buried-contact elements 704 shown in FIG. 7 can occupy less space within the SSRT device 700. This can allow a greater percentage of the SSRT device 700 to be dedicated to generating emissions, e.g., light, without sacrificing electrical connectivity between the second contact 702 and the second semiconductor material 424 or current spreading within the second semiconductor material 424. Moreover, the three-dimensional shape of the interfaces between the buried-contact elements 702 and the second semiconductor material 424 can facilitate enhanced electrical connection between the second contact 702 and the second semiconductor material 424. A process for forming the SSRT device 700 can include forming generally straight vias, e.g., using an anisotropic etching step, and partially or completely filling the vias with dielectric material. The process can also include forming generally straight channels within the vias, e.g., using another anisotropic etching step, after adding the dielectric material. The channels can be narrower than the vias and extend deeper into the second semiconductor material 424 than the vias. After forming the channels, the process can include partially or completely filling the channels with transparent material. Additional processing can be similar, for example, to that described above with reference to FIGS. 6D-6F or to that described below with reference to FIG. 9B.

Figure 8:
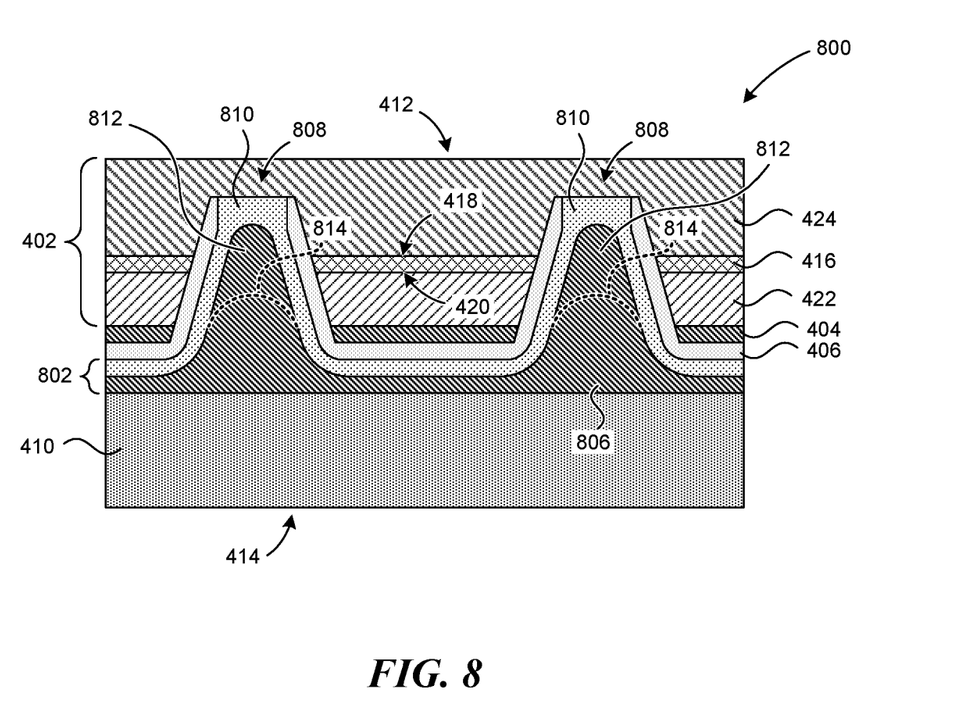
FIG. 8 is a partially-schematic, cross-sectional diagram illustrating an SSRT device configured in accordance with an embodiment of the present technology and having a conformal transparent layer.

Some embodiments configured in accordance with the present technology include buried-contact elements that are partially transparent and partially reflective. Furthermore, rather than being incorporated into plug-type forms, transparent material can be incorporated into layers, portions of layers, or other suitable forms. FIG. 8 is a partially schematic cross-sectional diagram illustrating an SSRT device 800 configured in accordance with an embodiment of the present technology and having a second contact 802 including a transparent layer 804 that is generally continuous and conformal. The second contact 802 can further include a base portion 806 and buried-contact elements 808 having transparent portions 810 and reflective portions 812, with the transparent portions 810 being between the reflective portions 812 and the second semiconductor material 424. The transparent portions 810 can be portions of the transparent layer 804, and the reflective portions 810 can be portions of the base portion 806 of the second contact 802. The side surfaces of the reflective portions 812 are shown angled in FIG. 8. This can cause a greater percentage of light that the side surfaces reflect to be directed toward the first side 412 of the SSRT device 800 than if the side surfaces were straight. Each time light is reflected within an SSRT device, some energy loss to absorption occurs. Directing reflected light to the first side 412 of the SSRT device 800 can reduce the total internal reflection within the SSRT device 800 and increase its lumen output and/or efficiency.

In some embodiments, the location of an interface between a transparent portion and a reflective portion of a buried-contact element can be selected to enhance one or more performance characteristics of an SSRT device. For example, the broken lines in FIG. 8 show alternative interface locations 814 for interfaces between the transparent portions 810 and the reflective portions 812. If the active region 416 is considered to define an active-region plane and the first contact 404 is considered to define a first-contact plane, the alternative interface locations 814 are shown between the active-region plane and the first-contact plane. Locating interfaces between the transparent portions 810 and the reflective portions 812 generally proximate to the active-region plane or generally between the active-region plane and the first-contact plane can enhance lumen output and/or efficiency of the SSRT device 800. Emissions from the active region 416 directed toward the first side 412 of the SSRT device 800 can pass through the transparent portion 810 with little or no interference. Emissions from the active region 416 directed away from the first side 412 of the SSRT device 800 and toward the reflective portions 812 can reflect off the angled sides of the reflective portions 812 and be at least partially redirected toward the first side 412 of the SSRT device 800. In this way, total internal reflection within the SSRT device 800 can be reduced and lumen output and/or efficiency can be increased.

Figure 9A:
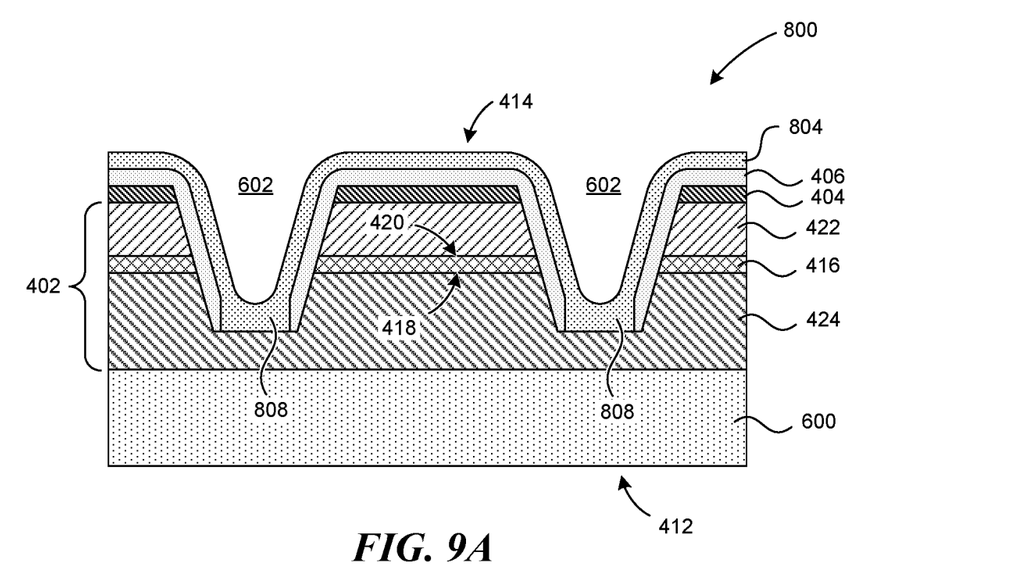
FIGS. 9A-9B are partially-schematic, cross-sectional diagrams illustrating selected stages in a method for making the SSRT device shown in FIG. 8.
Figure 9B:
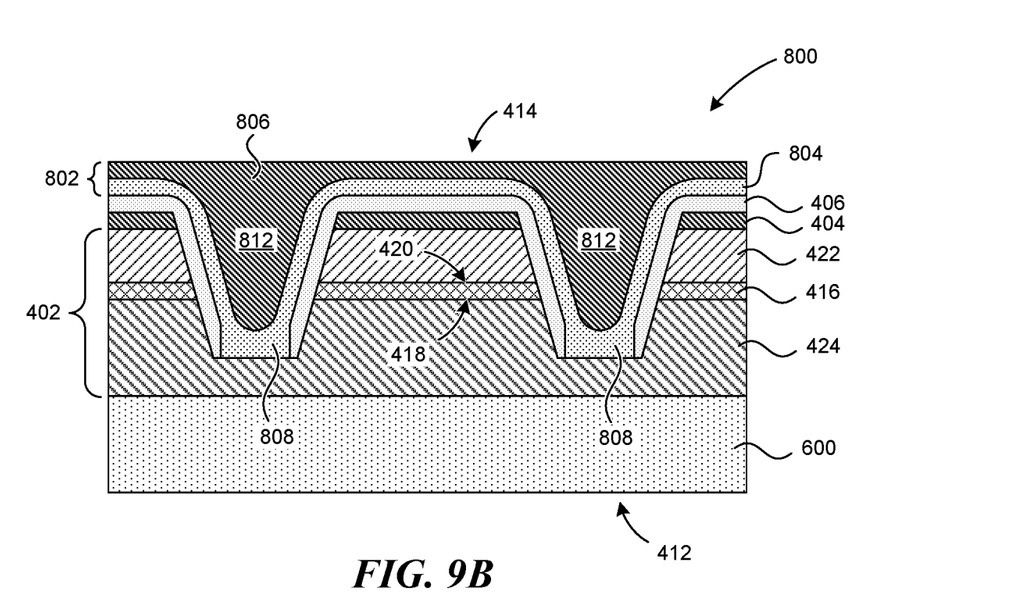

FIGS. 9A-9B illustrate a method for making the SSRT device 800 shown in FIG. 8 according to an embodiment of the present technology. Only selected stages are shown to illustrate certain aspects of the present technology. Initial stages in the process can be similar, for example, to those described above with reference to FIGS. 6A-6C. At the stage shown in FIG. 9A, the transparent layer 804 has already been formed over the dielectric 406 and within the vias 602. The transparent layer 804 can include, for example, indium tin oxide, doped zinc oxide (e.g., aluminum-doped, gallium-doped, and indium-doped zinc oxide), a conductive polymer (e.g., polyaniline and poly(3,4-ethylenedioxythiophene)), a carbon allotrope (e.g., carbon nanotubes and graphene), a combination thereof, or another suitable material. The transparent layer 804 can be formed using chemical vapor deposition, physical vapor deposition, atomic layer deposition, spin coating, patterning, combinations thereof, or other suitable formation processes known in the semiconductor fabrication arts.

FIG. 9B illustrates a stage in the process after the base portion 806 has been formed on the transparent layer 804. The base portion 806 can be formed using chemical vapor deposition, physical vapor deposition, atomic layer deposition, spin coating, patterning, combinations thereof, or other suitable formation processes known in the semiconductor fabrication arts. The side of the base portion 806 at the second side 414 of the SSRT device 800 is shown generally flat, which can be the result of a planarization process after forming the base portion 806. The base portion 806 can include a reflective contact material, e.g., titanium, nickel, silver, aluminum, gold, or a combination thereof, among others. Similar to the base portion 428 of the SSRT device 400 shown in FIG. 4, the base portion 806 is shown not directly contacting the second semiconductor material 424. Accordingly, the composition of the base portion 806 can be selected according to factors other than its ability to form an adequate electrical connection with the second semiconductor material 424. For example, the base portion 428 can include silver when the second semiconductor material 424 includes N-type gallium nitride. In some embodiments, the reflective portions 812 of the buried-contact elements 808 are formed separately from other parts of the base portion 806. For example, parts of the base portion 806 that the first contact 404 will block from receiving emissions can be made in a separate step from a less reflective material than the reflective portions 812. Similarly, the base portion 806 can alternatively include two or more layers, e.g., a highly-reflective layer (not shown) adjacent to the transparent layer 804 and a less-reflective layer (not shown) spaced apart from the transparent layer 804. The highly-reflective layer, for example, can include silver. After the stage shown in FIG. 9B, further processing can be performed, e.g., processing similar to that described above with reference to FIG. 6F. This processing can include removing the growth substrate 600 and attaching the carrier substrate 410 (FIG. 8) to form the SSRT device 800 shown in FIG. 8.

Figure 10:
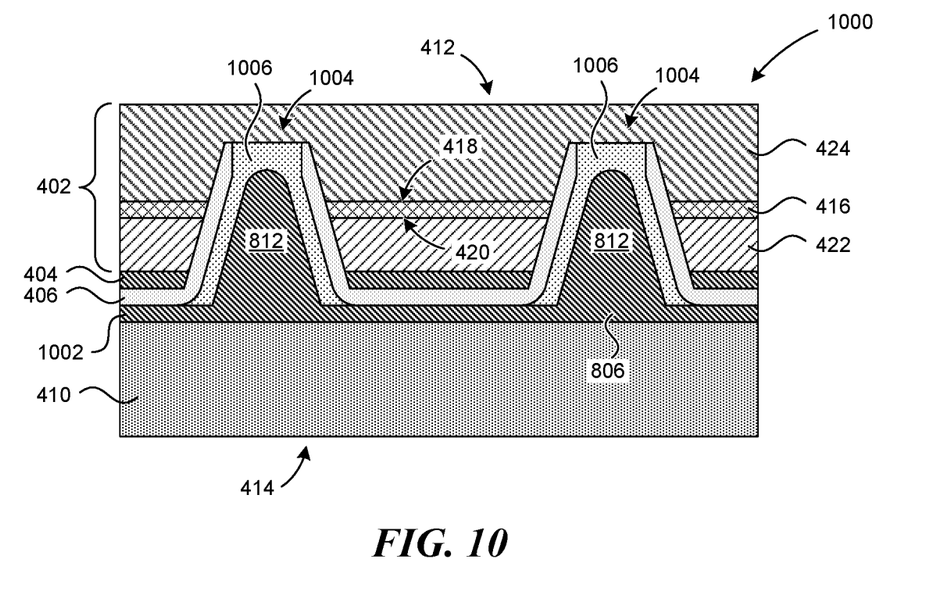
FIG. 10 is a partially-schematic, cross-sectional diagram illustrating an SSRT device configured in accordance with an embodiment of the present technology and having buried contacts with conformal transparent portions in tapered vias.

FIG. 10 is a partially-schematic, cross-sectional diagram illustrating an SSRT device 1000 configured in accordance with an embodiment of the present technology and having a second contact 1002 including buried-contact elements 1004 with transparent portions 1006. In contrast to the SSRT device 800 shown in FIG. 8, the transparent portions 1006 are not within a continuous transparent layer. A process for making the SSRT device 1000 can include planarizing the SSRT device 800 shown in FIG. 9A to remove portions of the transparent layer 804 (FIG. 9A) outside the vias (FIG. 9A) and then forming the base portion 806. In some embodiments, the reflective portions 812 can have a different composition than other parts of the base portion 806 and forming the SSRT device 1000 can include forming the reflective portions 812 on the SSRT device 800 shown in FIG. 9A and then planarizing reflective material and transparent material to expose the dielectric 406. A planar part of the base portion 806 can then be formed in a separate step. The planar part can have a composition that is less reflective than the composition of the reflective portions 812.

Figure 11:
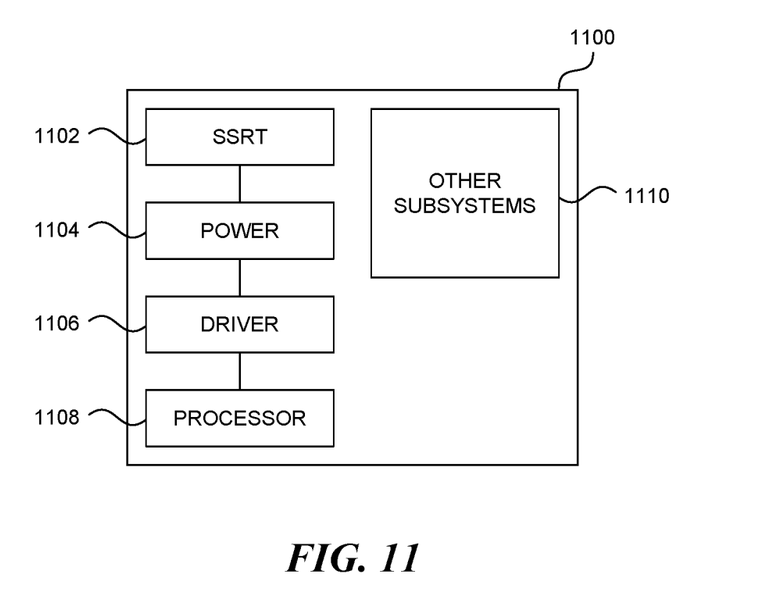
FIG. 11 is a block diagram illustrating a system that incorporates an SSRT device in accordance with an embodiment of the present technology.

Any of the packaged SSRT devices described above with reference to FIGS. 4-10 can be incorporated into any of a myriad of larger and/or more complex systems, a representative example of which is the system 1100 shown schematically in FIG. 11. The system 1100 can include an SSRT device 1102, a power source 1104, a driver 1106, a processor 1108, and/or other subsystems or components 1110. The system 1100 can perform any of a wide variety of functions, such as backlighting, general illumination, power generation, sensing, and/or other functions. Accordingly, the system 1100 can include, without limitation, hand-held devices (e.g., cellular or mobile phones, tablets, digital readers, and digital audio players), lasers, photovoltaic cells, remote controls, computers, and appliances (e.g., refrigerators). Components of the system 1100 can be housed in a single unit or distributed over multiple, interconnected units, e.g., through a communications network. The components of the system 1100 can also include local and/or remote memory storage devices, and any of a wide variety of suitable computer-readable media.

The foregoing description provides many specific details for a thorough understanding of, and enabling description for, embodiments of the present technology. Well-known structures and systems as well as methods often associated with such structures and systems have not been shown or described in detail to avoid unnecessarily obscuring the description of the various embodiments of the disclosure. In addition, those of ordinary skill in the relevant art will understand that additional embodiments can be practiced without several of the details described herein.

Throughout this disclosure, the singular terms "a," "an," and "the" include plural referents unless the context clearly indicates otherwise. Similarly, the word "or" is intended to include "and" unless the context clearly indicates otherwise. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations, means that a particular feature, structure, operation, or characteristic described in connection with the embodiment is included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the technology have been described herein for purposes of illustration, but that various modifications may be made without deviating from the disclosure. For example, each of the SSRT devices 400, 500, 700, 800, 1000 shown in FIGS. 4-10 includes two interconnected buried-contact elements. It will be understood by a person of ordinary skill in the relevant art that the illustrated buried-contact elements are representative only and that SSRT devices configured in accordance with the present technology can include any suitable number of buried-contact elements. For example, additional buried-contact elements can be present to the left and/or to the right of the buried-contact elements shown in FIGS. 4-10 and the illustrated buried-contact elements can be from a single row of a much larger array of buried-contact elements. Certain aspects of the technology described in the context of particular embodiments may be combined or eliminated in other embodiments. For example, the color-converting component 502 and the encapsulant lens 504 of the SSRT device 500 shown in FIG. 5 can be combined with the SSRT devices 700, 800, 1000 shown in FIGS. 7, 8, and 10. Additionally, while advantages associated with certain embodiments of the present technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:
1. A light-emitting diode device, comprising:
a light-emitting diode including—
a first semiconductor material,
a second semiconductor material, and
an active region between the first semiconductor material and the second semiconductor material;
a first contact electrically coupled to the first semiconductor material;
a second contact including a buried-contact element electrically coupled to the second semiconductor material, wherein the buried-contact element has an end portion directly adjacent to the second semiconductor material, and wherein the end portion of the buried-contact element is transparent; and
an optical component disposed over the second semiconductor material, the optical component including—
a transparent matrix, and
color-converting particles within the matrix, wherein the color-converting particles are configured to absorb radiation from the light-emitting diode at a first wavelength within the first wavelength range and to emit radiation at a second wavelength within the second wavelength range different than the first wavelength range,
wherein the light-emitting diode device has an average reflectivity of backscatter radiation from the color-converting particles at the buried-contact element, and wherein the average reflectivity is greater than 75%.
2. The light-emitting diode device of claim 1 wherein the average reflectivity of backscatter radiation is greater than 80%.
3. The light-emitting diode device of claim 1 wherein:
the end portion of the buried-contact element includes—
a first transparent and electrically conductive material, and
a second transparent and electrically conductive material between the first transparent and electrically conductive material and the second semiconductor material, and
the second transparent and electrically conductive material is an alloy including the first transparent and electrically conductive material and the second semiconductor material.

4. The light-emitting diode device of claim 1 wherein the end portion of the buried-contact element includes indium tin oxide, zinc oxide, or a combination thereof.
5. The light-emitting diode device of claim 1 wherein:
the end portion of the buried-contact element is a second end portion;
the buried-contact element has a first end portion opposite the second end portion; and
the first end portion of the buried-contact element is planarized.
6. The light-emitting diode device of claim 1 wherein:
the end portion of the buried-contact element is a second end portion;
the buried-contact element has a first end portion opposite the second end portion; and
the light-emitting diode device further comprises an electrically conductive base having a reflective surface adjacent to the first end portion of the buried-contact element.
7. The light-emitting diode device of claim 1, wherein:
the buried-contact element is a first buried-contact element;
the second contact includes a second buried-contact element electrically coupled to the second semiconductor material;
the second buried-contact element is laterally spaced apart from the first buried-contact element;
the second buried-contact element has an end portion directly adjacent to the second semiconductor material; and
the end portion of the second buried-contact element is transparent.
8. The light-emitting diode device of claim 7 wherein:
the respective end portions of the first and second buried-contact elements are respective second end portions;
the first and second buried-contact elements have respective first end portions opposite the respective second end portions;
the light-emitting diode device further comprises an electrically conductive base having a reflective surface adjacent to the respective first end portions of the first and second buried-contact elements; and
the reflective surface is planar and continuous between the respective first end portions of the first and second buried-contact elements.
9. The light-emitting diode device of claim 1 wherein the buried-contact element is less than 10% transparent by volume.
10. The light-emitting diode device of claim 1 wherein the buried-contact element is at least 50% transparent by volume.
11. The light-emitting diode device of claim 1 wherein:
the light-emitting diode device further comprises a via having an opening;
the via extend from the opening, through the first contact, through the first semiconductor material, and through the active region, to the second semiconductor material; and
the buried-contact element is within the via.
12. The light-emitting diode device of claim 11 wherein the buried-contact element includes a reflective portion between the end portion and the opening.
13. The light-emitting diode device of claim 11 wherein the via is not tapered.
14. The light-emitting diode device of claim 11 wherein the via tapers inwardly from the opening toward the second semiconductor material.

15. The light-emitting diode device of claim 14 wherein the end portion of the buried-contact element is not tapered.

16. The light-emitting diode device of claim 11, further comprising transparent dielectric material within the via.

17. The light-emitting diode device of claim 16 wherein the buried-contact element protrudes into the second semiconductor material beyond an end portion of the dielectric material at the second semiconductor.

18. The light-emitting diode device of claim 16 wherein the transparent dielectric material is planarized at the opening.

* * * * *